United States Patent
Cui

(10) Patent No.: US 10,991,775 B2
(45) Date of Patent: Apr. 27, 2021

(54) DISPLAY SUBSTRATE, FABRICATION METHOD THEREOF, AND DISPLAY PANEL

(71) Applicant: BOE Technology Group Co., Ltd., Beijing (CN)

(72) Inventor: Ying Cui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/417,819

(22) Filed: May 21, 2019

(65) Prior Publication Data

US 2020/0135816 A1    Apr. 30, 2020

(30) Foreign Application Priority Data

Oct. 30, 2018  (CN) .......................... 201811275397.X

(51) Int. Cl.
| | | |
|---|---|---|
| *H01L 27/32* | (2006.01) | |
| *H01L 51/00* | (2006.01) | |
| *H01L 51/52* | (2006.01) | |
| *H01L 51/56* | (2006.01) | |

(52) U.S. Cl.
CPC ...... *H01L 27/3246* (2013.01); *H01L 51/0005* (2013.01); *H01L 51/0096* (2013.01); *H01L 51/5228* (2013.01); *H01L 51/56* (2013.01)

(58) Field of Classification Search
CPC ............. H01L 51/5228; H01L 27/3246; H01L 51/0005; H01L 51/0096; H01L 51/56
See application file for complete search history.

(56) References Cited

U.S. PATENT DOCUMENTS

| | | | |
|---|---|---|---|
| 2006/0017375 A1 | 1/2006 | Noguchi et al. | |
| 2014/0011013 A1* | 1/2014 | Jin ..................... | H01L 31/02366 428/297.4 |
| 2016/0043150 A1* | 2/2016 | Wang ...................... | H01L 51/56 257/40 |
| 2016/0172423 A1* | 6/2016 | Nendai ............... | H01L 51/0005 257/40 |

FOREIGN PATENT DOCUMENTS

| | | | |
|---|---|---|---|
| CN | 105742332 A | | 7/2016 |
| CN | 105826358 A | | 8/2016 |
| CN | 107808897 A | | 3/2018 |
| CN | 207977317 U | | 10/2018 |
| CN | 201820307095 U | * | 10/2018 |

OTHER PUBLICATIONS

May 8, 2020—(CN) First Office Action Appn 201811275397.X with English Translation.

* cited by examiner

*Primary Examiner* — Bilkis Jahan
*Assistant Examiner* — Victor V Barzykin
(74) *Attorney, Agent, or Firm* — Banner & Witcoff, Ltd.

(57) ABSTRACT

A display substrate and a fabrication method thereof, and a display panel are disclosed. The display substrate includes: a base substrate; a pixel defining layer, on the base substrate and configured to define a plurality of sub-pixel regions, each sub-pixel region including a first electrode layer and a second electrode layer; an auxiliary electrode layer, on at least a portion of the pixel defining layer, the auxiliary electrode layer having a hydrophobic surface, and the hydrophobic surface being configured to be in contact with and electrically connected with the second electrode layer.

15 Claims, 19 Drawing Sheets

```
┌─────────────────────────────────────────────────────────────────┐
│                    Providing a base substrate                    │
└─────────────────────────────────────────────────────────────────┘
                                  │
                                  ▼
┌─────────────────────────────────────────────────────────────────┐
│ Forming a pixel defining layer on the base substrate, the pixel  │
│   defining layer being configured to define a plurality of       │
│                      sub-pixel regions                           │
└─────────────────────────────────────────────────────────────────┘
                                  │
                                  ▼
┌─────────────────────────────────────────────────────────────────┐
│ Forming a first electrode layer and a second electrode layer     │
│           that are located in each sub-pixel region              │
└─────────────────────────────────────────────────────────────────┘
                                  │
                                  ▼
┌─────────────────────────────────────────────────────────────────┐
│ Forming an auxiliary electrode layer on at least a portion of    │
│ the pixel defining layer, the auxiliary electrode layer having   │
│ a hydrophobic surface, and the hydrophobic surface being         │
│ configured to be in contact with and electrically connected      │
│                  with the second electrode layer                 │
└─────────────────────────────────────────────────────────────────┘
```

FIG. 20

DISPLAY SUBSTRATE, FABRICATION METHOD THEREOF, AND DISPLAY PANEL

CROSS-REFERENCE TO RELATED APPLICATIONS

The present application claims priority of Chinese Patent Application No. 201811275397.X filed on Oct. 30, 2018, the disclosure of which is incorporated herein by reference in its entirety as part of the present application.

TECHNICAL FIELD

Embodiments of the present application relate to a display substrate, a fabrication method thereof, and a display panel.

BACKGROUND

With development of display technologies, Organic Light-Emitting Diode (OLED) display panels have been widely applied.

SUMMARY

The embodiments of the present application provide a display substrate and a fabrication method thereof, and a display panel.

In an aspect, an embodiment of the present application provides a display substrate, comprising:

a base substrate;

a pixel defining layer, on the base substrate and configured to define a plurality of sub-pixel regions, each of the plurality of sub-pixel regions comprising a first electrode layer and a second electrode layer; and an auxiliary electrode layer, on at least a portion of the pixel defining layer, the auxiliary electrode layer having a hydrophobic surface, and the hydrophobic surface being configured to be in contact with and electrically connected with the second electrode layer.

In at least some embodiments, the hydrophobic surface is a surface of the auxiliary electrode layer that is away from the pixel defining layer, and the hydrophobic surface comprises a plurality of micro-nano sized structures.

In at least some embodiments, the plurality of micro-nano sized structures comprise a plurality of protrusions in micron scale or nanometer scale or a plurality of grooves in micron scale or nanometer scale.

In at least some embodiments, the pixel defining layer comprises a plurality of first defining strips arranged in parallel and a plurality of second defining strips arranged in parallel, a plurality of sub-pixel regions of a same color are provided between two adjacent first defining strips of the plurality of first defining strips, a plurality of sub-pixel regions of different colors are provided between two adjacent second defining strips of the plurality of second defining strips, and a height of each of the plurality of first defining strips with respect to the base substrate is greater than a height of each of the plurality of second defining strips with respect to the base substrate.

In at least some embodiments, the auxiliary electrode layer comprises an auxiliary electrode strip on each of the plurality of second defining strips, and the auxiliary electrode strip covers an entire top surface of each of the plurality of second defining strips.

In at least some embodiments, a sum of thicknesses of each of the second defining strips and an auxiliary electrode strip thereon is less than a thickness of each of the plurality of first defining strips.

In at least some embodiments, the auxiliary electrode layer completely overlaps with the plurality of second defining strips in a direction perpendicular to the base substrate.

In another aspect, an embodiment of the present application provides a display panel, comprising the afore-mentioned display substrate.

In still another aspect, an embodiment of the present application provides a fabrication method of a display substrate, comprising:

providing a base substrate;

forming a pixel defining layer on the base substrate, the pixel defining layer being configured to define a plurality of sub-pixel regions;

forming a first electrode layer and a second electrode layer in each of the plurality of sub-pixel regions; and forming an auxiliary electrode layer on at least a portion of the pixel defining layer, the auxiliary electrode layer having a hydrophobic surface, and the hydrophobic surface being configured to be in contact with and electrically connected with the second electrode layer.

In at least some embodiments, the hydrophobic surface is a surface of the auxiliary electrode layer that is away from the pixel defining layer, and the hydrophobic surface comprises a plurality of micro-nano sized structures.

In at least some embodiments, the plurality of micro-nano sized structures comprise a plurality of protrusions or a plurality of grooves on micron scale or nanometer scale.

In at least some embodiments, the forming an auxiliary electrode layer on at least a portion of the pixel defining layer, comprises: forming a conductive layer on at least a portion of the pixel defining layer, and etching a surface of the conductive layer that is away from the pixel defining layer to obtain the auxiliary electrode layer having the plurality of micro-nano sized structures.

In at least some embodiments, the forming a pixel defining layer on the base substrate comprises: forming a plurality of first defining strips arranged in parallel on the base substrate, a plurality of sub-pixel regions of a same color being provided between two adjacent first defining strips of the plurality of first defining strips; and forming a plurality of second defining strips arranged in parallel on the base substrate, a plurality of sub-pixel regions of different colors being provided between two adjacent second defining strips of the plurality of second defining strips; a height of each of the plurality of first defining strips with respect to the base substrate being greater than a height of each of the plurality of second defining strips with respect to the base substrate.

In at least some embodiments, the forming an auxiliary electrode layer on at least a portion of the pixel defining layer comprises: forming an auxiliary electrode strip on each of the plurality of second defining strips, the auxiliary electrode strip covering an entire top surface of each of the plurality of second defining strips.

In at least some embodiments, a sum of thicknesses of each of the second defining strips and an auxiliary electrode strip thereon is less than a thickness of each of the first defining strips.

In at least some embodiments, the auxiliary electrode layer completely overlaps with the plurality of second defining strips in a direction perpendicular to the base substrate.

In at least some embodiments, after the forming the auxiliary electrode strip and before the forming the second electrode layer, the method further comprises: forming an organic functional layer by using a solution preparation method on the base substrate on which the auxiliary electrode strip is formed.

In at least some embodiments, the forming an organic functional layer by using a solution preparation method comprises: forming a solution for preparing the organic functional layer between the two adjacent second defining strips of the plurality of the second defining strips, the solution being configured to circulate in the plurality of sub-pixel regions of a same color located between the two adjacent second defining strips, the auxiliary electrode strip being located below the solution; and drying the solution to shrink the solution into each sub-pixel region of the plurality of sub-pixel regions of the same color.

In at least some embodiments, the solution preparation method comprises an inkjet printing method.

BRIEF DESCRIPTION OF THE DRAWINGS

In order to clearly illustrate the technical solution of the embodiments the present disclosure, the drawings to be used in description of the embodiments will be briefly described in the following; it is obvious that the described drawings are only related to some embodiments of the present disclosure. Based on the drawings, those skilled in the art can obtain other drawings, without any inventive work.

FIG. 20 is a flow chart of a fabrication method of a further display substrate provided by an embodiment of the present disclosure.

DETAILED DESCRIPTION

Figure 1:
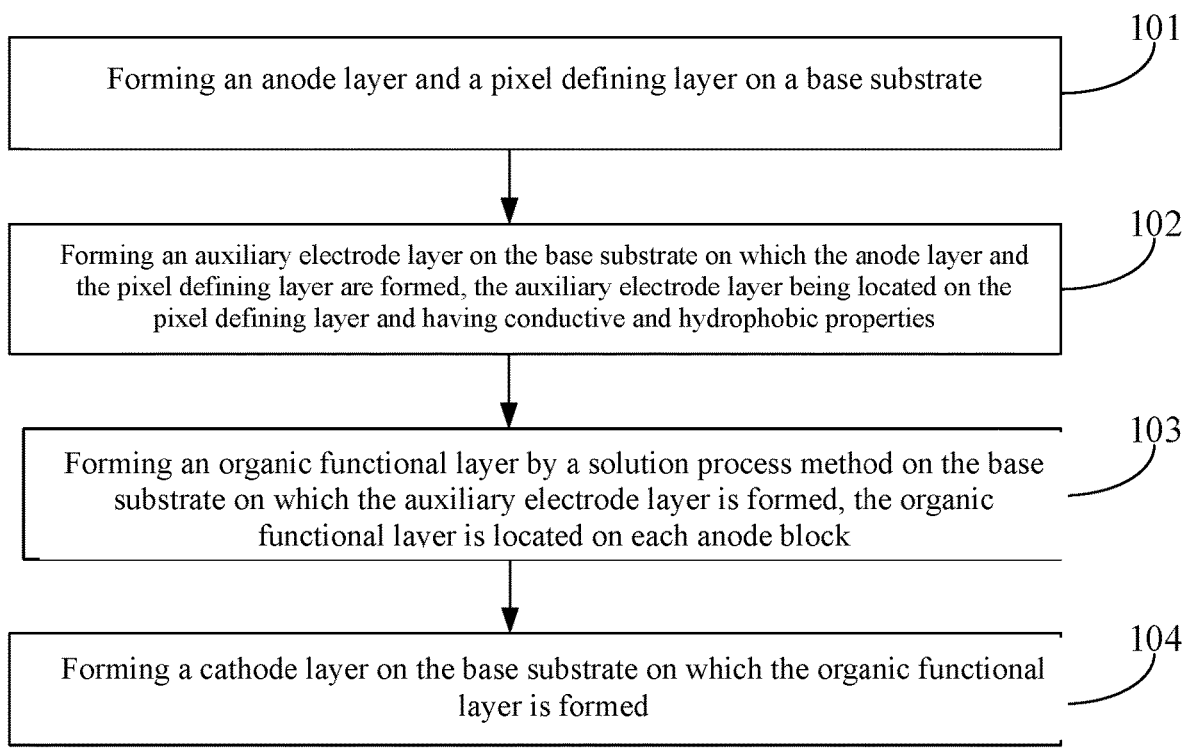
FIG. 1 is a flow chart of a fabrication method of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An OLED display substrate in an OLED display panel usually comprises a base substrate, as well as a pixel defining layer, an anode layer, an organic functional layer and a cathode layer provided on the base substrate. The pixel defining layer is used for defining a plurality of sub-pixel regions in the base substrate; the anode layer includes an anode block located in each sub-pixel region; the organic functional layer is located on each anode block; and the cathode layer covers the organic functional layer and is electrically connected with the organic functional layer.

In order to reduce voltage drop on the cathode layer, an auxiliary electrode layer is added to the pixel defining layer, and the cathode layer covers the auxiliary electrode layer and is electrically connected with the auxiliary electrode layer. During the fabrication of the OLED display substrate, the anode layer and the pixel defining layer are usually first formed on the base substrate, the auxiliary electrode layer is formed on the pixel defining layer, then the organic functional layer is formed on the anode layer, and finally the cathode layer covering both the organic functional layer and the auxiliary electrode layer is formed. For example, the organic functional layer is formed by inkjet printing.

When the organic functional layer is formed by inkjet printing, a solution for fabricating the organic functional layer is inevitable to be sprayed on the auxiliary electrode layer, because the auxiliary electrode layer has been provided on the base substrate before the formation of the organic functional layer. In this way, after the solution is dried, a portion of a solute in the solution may remain on the auxiliary electrode layer, which affects an electrical connection between the auxiliary electrode layer and the cathode, and further affects normal display of the OLED display panel.

Embodiments of the present disclosure provide a display substrate, a fabrication method of the display substrate, and a display panel, which can at least prevent a portion of a solute in a solution for fabricating an organic functional layer from remaining on the auxiliary electrode layer, and further prevent the solute of the solution from affecting an electrical connection between the auxiliary electrode layer and a cathode.

An embodiment of the present disclosure provides a display substrate, comprising: a base substrate; a pixel defining layer, located on the base substrate and configured to define a plurality of sub-pixel regions, each of the plurality of sub-pixel regions comprising a first electrode layer and a second electrode layer; an auxiliary electrode layer, located on at least a portion of the pixel defining layer, the auxiliary electrode layer having a hydrophobic surface, and the hydrophobic surface being configured to be in contact with and electrically connected with the second electrode layer.

In this embodiment, the surface of the auxiliary electrode layer has a hydrophobic property, which can prevent any residual material in a preparation process of the organic functional layer from remaining on the auxiliary electrode layer, and further prevent the residual material from affecting an electrical connection between the auxiliary electrode layer and the second electrode layer.

In at least some embodiments, the hydrophobic surface is a surface of the auxiliary electrode layer that is away from the pixel defining layer, and the hydrophobic surface includes a plurality of micro-nano sized structures.

In at least some embodiments, the plurality of micro-nano sized structures comprise a plurality of protrusions in micron scale or nanometer scale or a plurality of grooves in micron scale or nanometer scale.

In at least some embodiments, the pixel defining layer comprises a plurality of first defining strips arranged in parallel and a plurality of second defining strips arranged in parallel, a plurality of sub-pixel regions of a same color are provided between two adjacent first defining strips of the plurality of first defining strips, a plurality of sub-pixel regions of different colors are provided between two adjacent second defining strips of the plurality of second defining strips, and a height of each of the plurality of first defining strips with respect to the base substrate is greater than a height of each of the plurality of second defining strips with respect to the base substrate.

In at least some embodiments, the auxiliary electrode layer comprises an auxiliary electrode strip on each of the plurality of second defining strips, and the auxiliary electrode strip covers an entire top surface of each of the plurality of second defining strips.

In at least some embodiments, a sum of thicknesses of each of the plurality of second defining strips and an auxiliary electrode strip thereon is less than a thickness of each of the plurality of first defining strips.

In at least some embodiments, the auxiliary electrode layer completely overlaps with the plurality of second defining strips in a direction perpendicular to the base substrate.

Another embodiment of the present disclosure provides a fabrication method of a display substrate, comprising: providing a base substrate; forming a pixel defining layer on the base substrate, the pixel defining layer being configured to define a plurality of sub-pixel regions; forming a first electrode layer and a second electrode layer that are located in each of the plurality of sub-pixel regions; and forming an auxiliary electrode layer on at least a portion of the pixel defining layer, the auxiliary electrode layer having a hydrophobic surface, and the hydrophobic surface being configured to be in contact with and electrically connected with the second electrode layer.

In this embodiment, the surface of the auxiliary electrode layer has a hydrophobic property, which can prevent any residual material in the preparation process of the organic functional layer from remaining on the auxiliary electrode layer, and further prevent the residual material from affecting an electrical connection between the auxiliary electrode layer and the second electrode layer.

In the embodiment of the present disclosure, the first electrode layer is an anode layer, the second electrode layer is a cathode layer, and the organic functional layer is provided between the anode layer and the cathode layer. It may be understood by those skilled in the art that, the first electrode layer may also be set as a cathode layer and the second electrode layer as an anode layer, which can also achieve the objective of the present disclosure.

In at least some embodiments, the hydrophobic surface is a surface of the auxiliary electrode layer that is away from the pixel defining layer, and the hydrophobic surface comprises a plurality of micro-nano sized structures.

In at least some embodiments, the plurality of micro-nano sized structures comprise a plurality of protrusions or a plurality of grooves on micron scale or nanometer scale.

In at least some embodiments, the forming an auxiliary electrode layer on at least a portion of the pixel defining layer, comprises: forming a conductive layer on at least a portion of the pixel defining layer, and etching a surface of the conductive layer that is away from the pixel defining layer to obtain the auxiliary electrode layer having the plurality of micro-nano sized structures.

In at least some embodiments, the forming a pixel defining layer on the base substrate includes: forming a plurality of first defining strips arranged in parallel on the base substrate, a plurality of sub-pixel regions of a same color being provided between two adjacent first defining strips of the plurality of first defining strips; and forming a plurality of second defining strips arranged in parallel on the base substrate, a plurality of sub-pixel regions of different colors being provided between two adjacent second defining strips of the plurality of second defining strips; a height of each of the plurality of first defining strips with respect to the base substrate being greater than a height of each of the plurality of second defining strips with respect to the base substrate.

In at least some embodiments, the forming an auxiliary electrode layer on at least a portion of the pixel defining layer comprises: forming an auxiliary electrode strip on each of the second defining strips, the auxiliary electrode strip covering an entire top surface of each of the plurality of second defining strips.

In at least some embodiments, a sum of thicknesses of each of the second defining strips and an auxiliary electrode strip thereon is less than a thickness of each of the first defining strips.

In at least some embodiments, the auxiliary electrode layer completely overlaps with the plurality of second defining strips in a direction perpendicular to the base substrate.

In at least some embodiments, after the forming the auxiliary electrode strip and before the forming the second electrode layer, the method further comprises: forming an organic functional layer by using a solution preparation method on the base substrate on which the auxiliary electrode strip is formed.

In at least some embodiments, the forming an organic functional layer by using a solution preparation method comprises: forming a solution for preparing the organic functional layer between the two adjacent second defining strips of the plurality of the second defining strips, the solution being configured to circulate in the plurality of sub-pixel regions of a same color located between the two adjacent second defining strips, the auxiliary electrode strip being located below the solution; and drying the solution to shrink the solution into each sub-pixel region of the plurality of sub-pixel regions of the same color.

In at least some embodiments, the solution preparation method comprises an inkjet printing method.

Hereinafter, a specific structure of the display substrate provided by the embodiment of the present disclosure and a specific process of the fabrication method thereof are described in more detail with the following examples.

For example, FIG. 1 is a flow chart of a fabrication method of a display substrate provided by an embodiment of the present disclosure. As illustrated in FIG. 1, the fabrication method of the display substrate may comprise:

Step 101: forming an anode layer and a pixel defining layer on a base substrate.

For example, the pixel defining layer is configured to define a plurality of sub-pixel regions on the base substrate, and the anode layer includes: an anode block located in each sub-pixel region.

Step 102: forming an auxiliary electrode layer on the base substrate on which the anode layer and the pixel defining layer are formed, the auxiliary electrode layer being located on the pixel defining layer and having conductive and hydrophobic properties.

Step 103: forming an organic functional layer on the base substrate on which the auxiliary electrode layer is formed by a solution preparation method, the organic functional layer is located on each anode block.

Step 104: forming a cathode layer on the base substrate on which the organic functional layer is formed.

For example, the cathode layer is electrically connected with both the organic functional layer and the auxiliary electrode layer.

In the fabrication method of the display substrate provided by the embodiment of the present disclosure, the auxiliary electrode layer is located on the pixel defining layer, and the auxiliary electrode layer has conductive and hydrophobic properties. In this way, on the one hand, because the auxiliary electrode layer has the conductive property, the auxiliary electrode layer can be electrically connected with the cathode layer; on the other hand, because the auxiliary electrode layer further has the hydrophobic property, in the process of forming the organic functional layer by using the solution preparation method, it is hard for a solution to be sprayed and stay on the auxiliary electrode layer while the solution is used for preparation the organic functional layer; in this way, after the solution is dried, a solute of the solution does not remain on the auxiliary electrode layer, so that the auxiliary electrode layer can be better electrically connected with the cathode, and the display panel can display normally.

Figure 2:
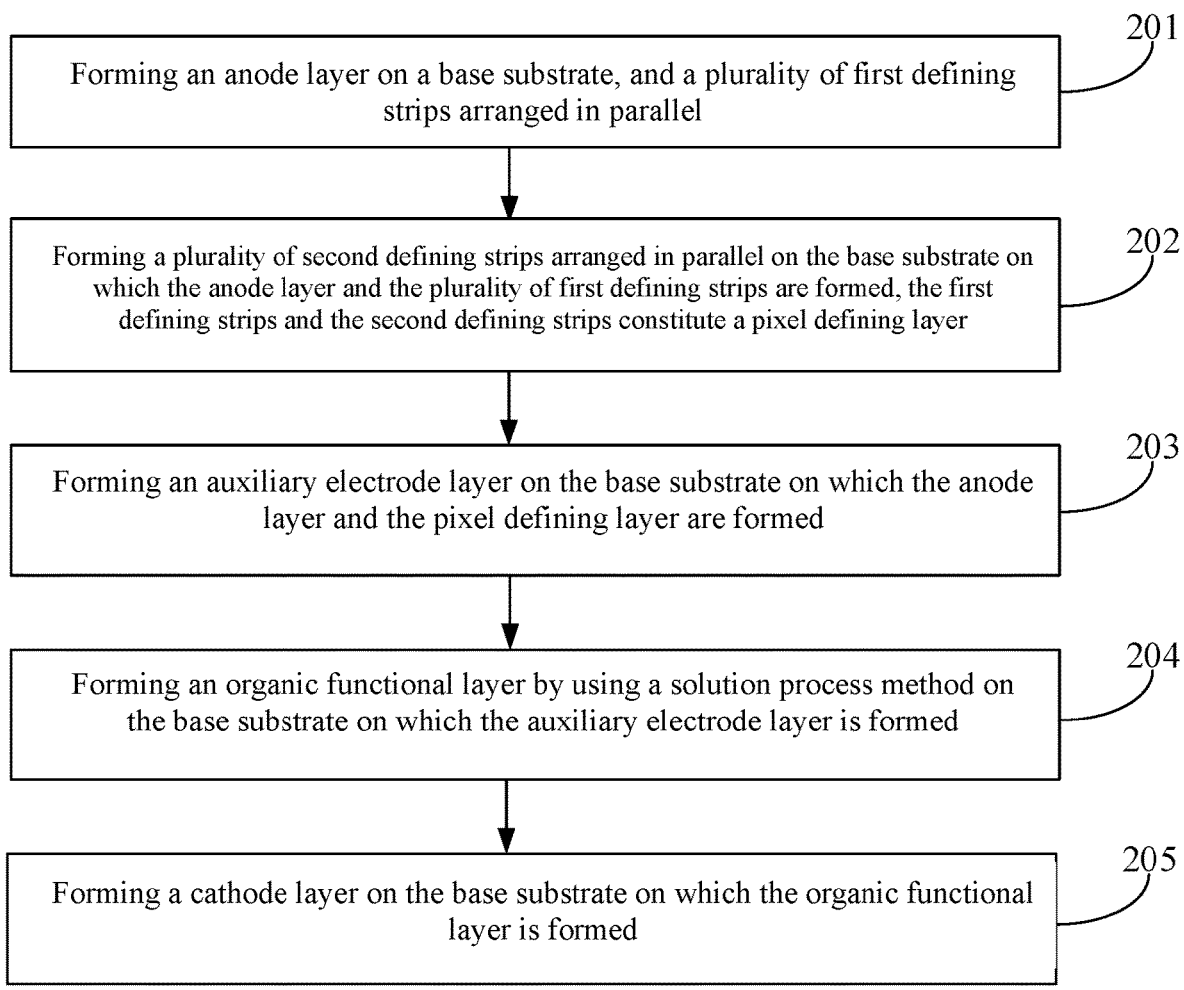
FIG. 2 is a flow chart of a fabrication method of another display substrate provided by an embodiment of the present disclosure.

FIG. 2 is a flow chart of a fabrication method of another display substrate provided by an embodiment of the present disclosure. As illustrated in FIG. 2, the fabrication method of the display substrate may comprise:

Step 201: forming an anode layer and a plurality of first defining strips arranged in parallel on a base substrate.

Figure 3:
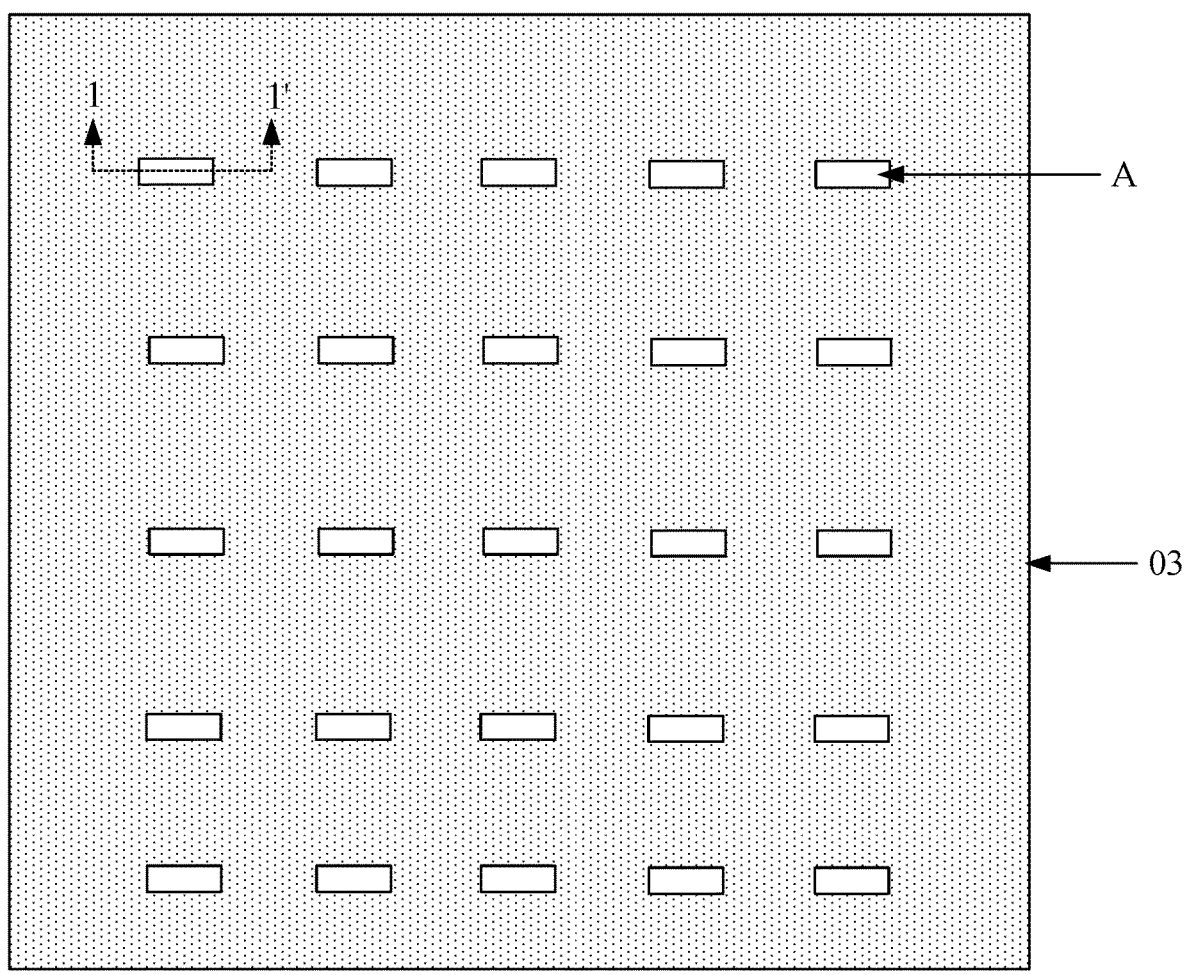
FIG. 3 is a structural schematic diagram of a display substrate provided by an embodiment of the present disclosure.
Figure 4:
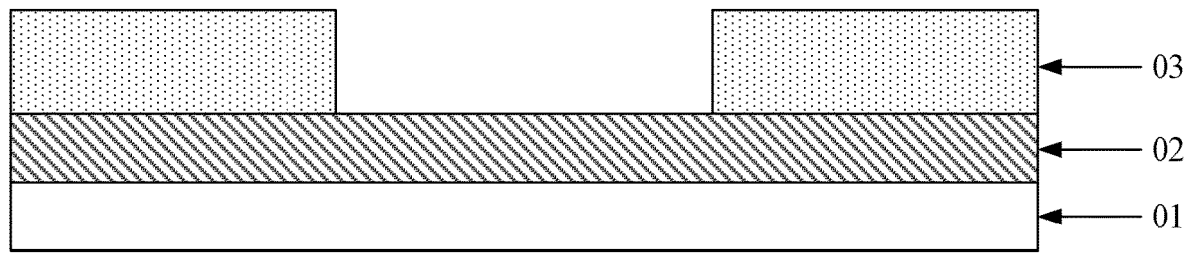
FIG. 4 is a schematically cross-section view taken along line 1-1' of FIG. 3.

FIG. 3 is a structural schematic diagram of the display substrate provided by the embodiment of the present disclosure; and FIG. 4 is a schematically cross-section view taken along line 1-1' of FIG. 3.

In combination with FIG. 3 and FIG. 4, optionally, before the anode layer is formed on the base substrate, a pixel circuit layer 02 and a planarization layer 03 provided with a via hole A are sequentially formed on the base substrate 01. For example, the pixel circuit layer 02 includes a pixel circuit corresponding to each sub-pixel region (not illustrated in FIG. 3 and FIG. 4). It should be noted that, the sub-pixel region refers to a region where a sub-pixel to be formed on the base substrate is located. For example, a region where a red sub-pixel (that is, a sub-pixel emitting red light) is located is red sub-pixel region, a region where a green sub-pixel (that is, a sub-pixel emitting green light) is located is green sub-pixel region, a region where a blue sub-pixel (that is, a sub-pixel emitting blue light) is located is blue sub-pixel region, or a region where a sub-pixel of other color is located.

As illustrated in FIG. 3, a plurality of via holes A may be formed in the planarization layer 03; it is explained in the embodiment of the present disclosure with a case where the number of via holes A within the planarization layer 03 is 25 as an example; optionally, the number of via holes A within the planarization layer 03 may be other number, for example, 20, 28, 30 and 56, etc., which will not be limited in the embodiment of the present disclosure.

Figure 5:
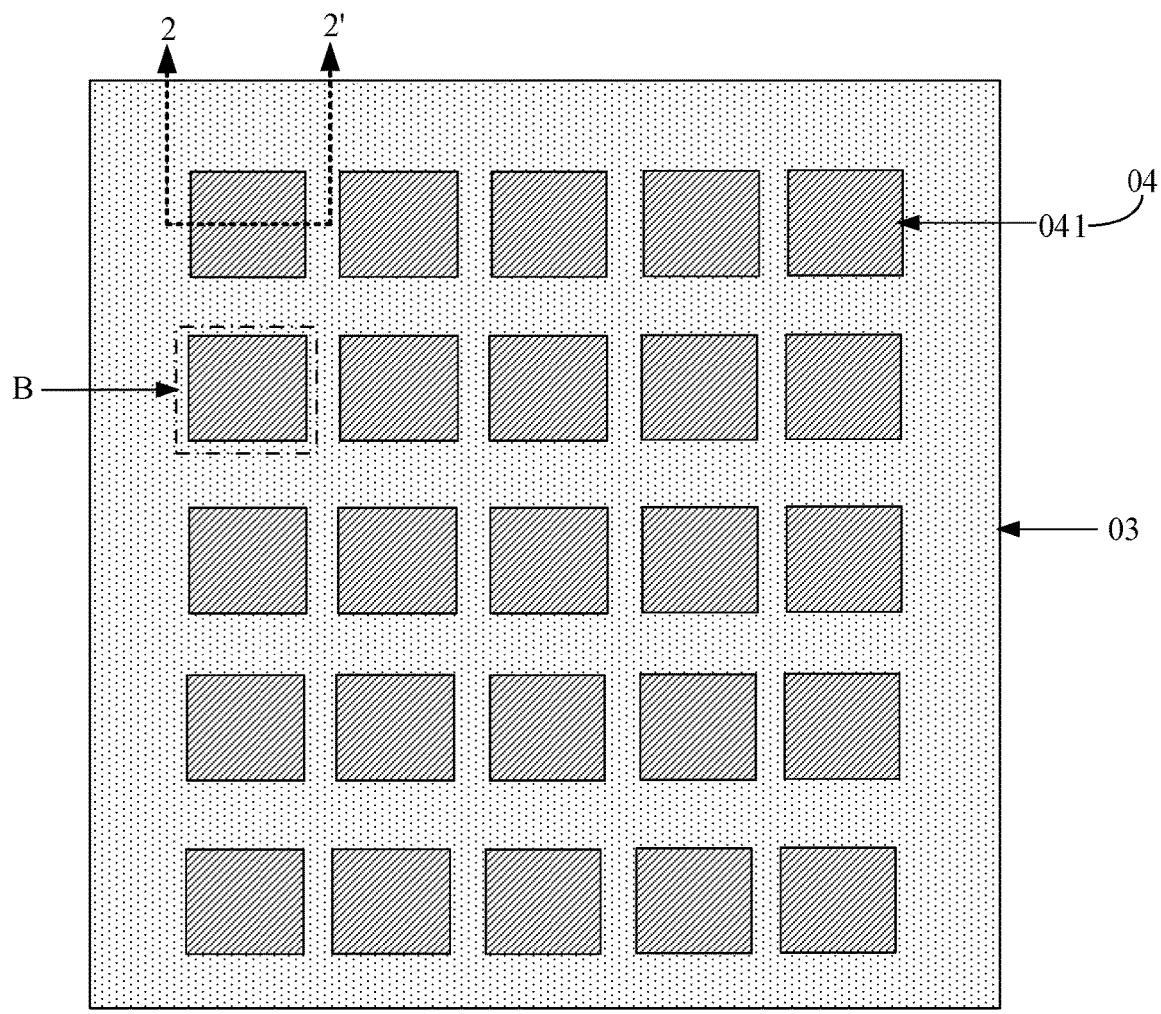
FIG. 5 is a structural schematic diagram of a display substrate provided by another embodiment of the present disclosure.
Figure 6:
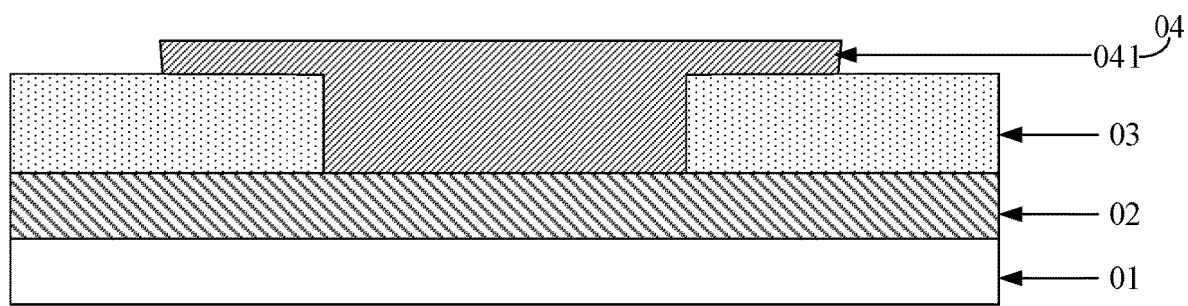
FIG. 6 is a schematically cross-section view taken along line 2-2' of FIG. 5.

As illustrated in FIG. 5 and FIG. 6, for example, an anode layer 04 is formed on the base substrate 01 on which the pixel circuit layer 02 and the planarization layer 03 are formed. FIG. 6 is a schematically cross-section view taken along line 2-2' of FIG. 5. In combination with FIG. 5 and FIG. 6, the anode layer 04 includes: an anode block 041 located within each sub-pixel region B. At this time, an anode block 041 within each sub-pixel region may be connected with a pixel circuit corresponding to the sub-pixel region through the via hole within the sub-pixel region.

It should be noted that, the display substrate may have a plurality of sub-pixel regions thereon; it is explained in the embodiment of the present disclosure with a case where the number of sub-pixel regions B on the display substrate is 25 as an example; and optionally, the number of sub-pixel regions on the display substrate may also be other number, for example, 20, 30, 40 and 80, etc., which will not be limited in the embodiment of the present disclosure.

Figure 7:
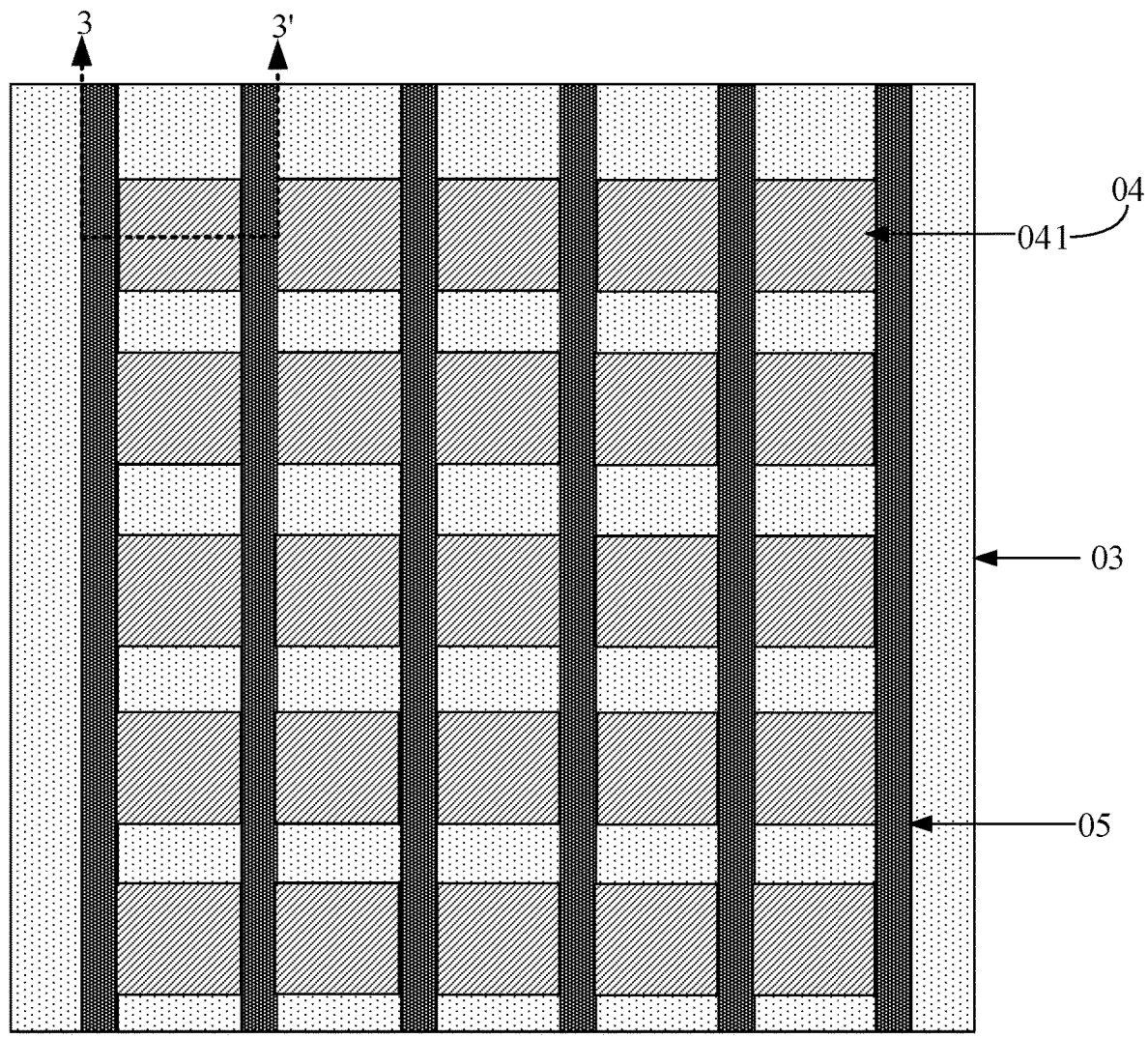
FIG. 7 is a structural schematic diagram of a display substrate provided by a further embodiment of the present disclosure.
Figure 8:
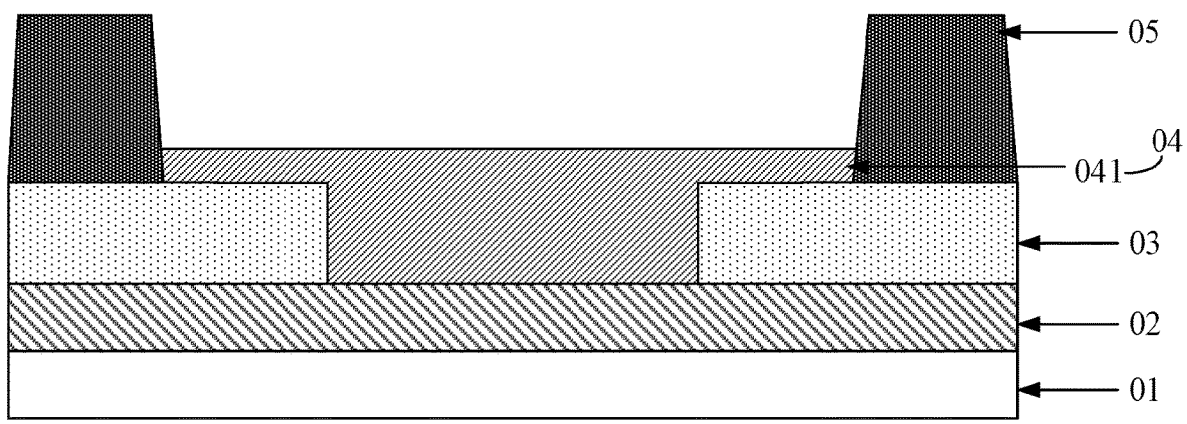
FIG. 8 is a schematically cross-section view taken along line 3-3' of FIG. 7.

As illustrated in FIG. 7 and FIG. 8, for example, a plurality of first defining strips 05 arranged in parallel are formed on the base substrate on which the anode layer is formed. FIG. 8 is a schematically cross-section view taken along line 3-3' of FIG. 7. It can be seen from FIG. 8 that, a cross section of the first defining strip 05 may be trapezoidal; and optionally, the cross section of the first defining strip 05 may also be of other shape, for example, a rectangle, or a square, etc., which will not be limited in the embodiment of the present disclosure.

It should be noted that, there may be a plurality of first defining strips 05 on the display substrate; it is explained in the embodiment of the present disclosure with a case where the number of first defining strips 05 on the display substrate is 6 as an example; and optionally, the number of first defining strips 05 on the display substrate may also be other number, for example, 4, 7, 9 and 12, etc., which will not be limited in the embodiment of the present disclosure.

Optionally, the step of forming a first defining strip on the base substrate includes: firstly forming a first defining strip material layer on the base substrate, and then patterning the first defining strip material layer by using a single patterning process, so that the first defining strip may be obtained.

For example, the single patterning process includes: photoresist coating, exposure, development, etching, photoresist stripping, and so on. For example, the patterning the first defining strip material layer by using a single patterning process includes: coating a layer of photoresist on the base substrate on which the first defining strip material layer is formed; then exposing the photoresist with a mask, so that the photoresist is formed into a fully-exposed region and a non-exposed region; next, processing by using a developing process, to remove the photoresist in the fully-exposed region and reserve photoresist in the non-exposed region; thereafter, etching a region of a transparent conductive material layer corresponding to the fully-exposed region; and after the etching is completed, stripping the photoresist in the non-exposed region to obtain the first defining strip 05.

Step 202: forming a plurality of second defining strips arranged in parallel on the base substrate on which the anode layer and the plurality of first defining strips are formed, the plurality of first defining strips and the plurality of second defining strips constitute a pixel defining layer.

Figure 9:
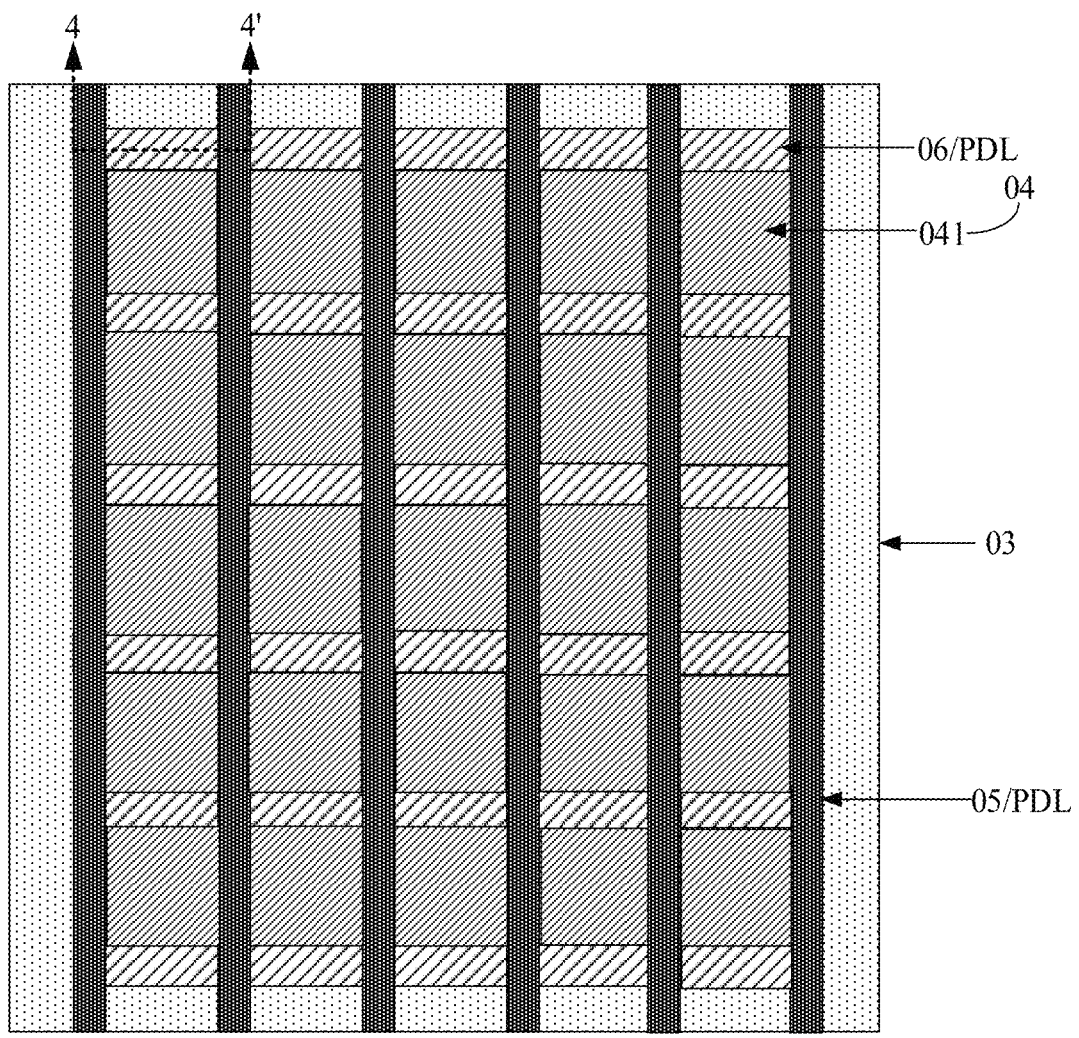
FIG. 9 is a structural schematic diagram of a display substrate provided by still another embodiment of the present disclosure.
Figure 10:
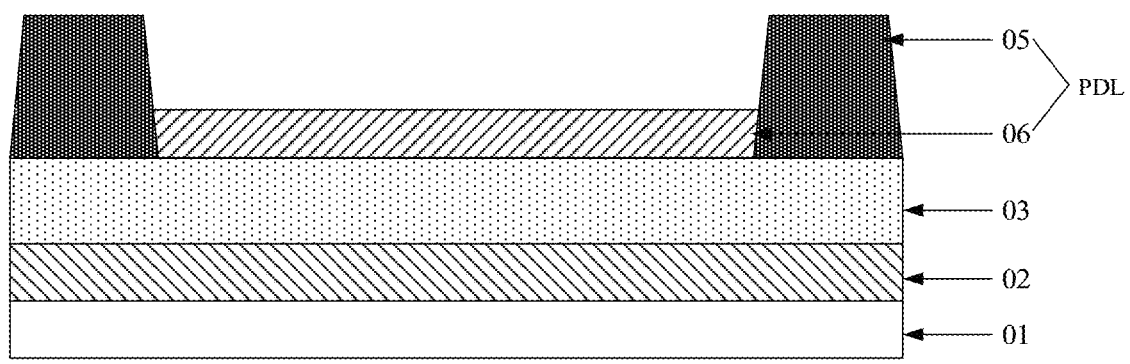
FIG. 10 is a schematically cross-section view taken along line 4-4' of FIG. 9.

For example, after a plurality of first defining layers are formed on the base substrate 01, as illustrated in FIG. 9 and FIG. 10, a plurality of second defining layers 06 arranged in parallel are formed, and FIG. 10 is a schematically cross-section view taken along line 4-4' of FIG. 9. The plurality of first defining strips 05 formed in step 201 intersect with the plurality of second defining strips 06 formed in step 202, the first defining strips 05 and the second defining strips 06 may constitute the pixel defining layer (PDL), and the pixel defining layer (PDL) is used for defining a plurality of sub-pixel regions (not illustrated in FIG. 9 and FIG. 10) on the base substrate 01.

It should be noted that, there may also be a plurality of second defining strips 06 on the display substrate; it is explained in the embodiment of the present disclosure with a case where the number of second defining strips 06 on the display substrate is 6 as an example; and optionally, the number of second defining strips 06 on the display substrate may also be other number, for example, 4, 7, 9 and 12, etc., which will not be limited in the embodiment of the present disclosure.

Figure 11:
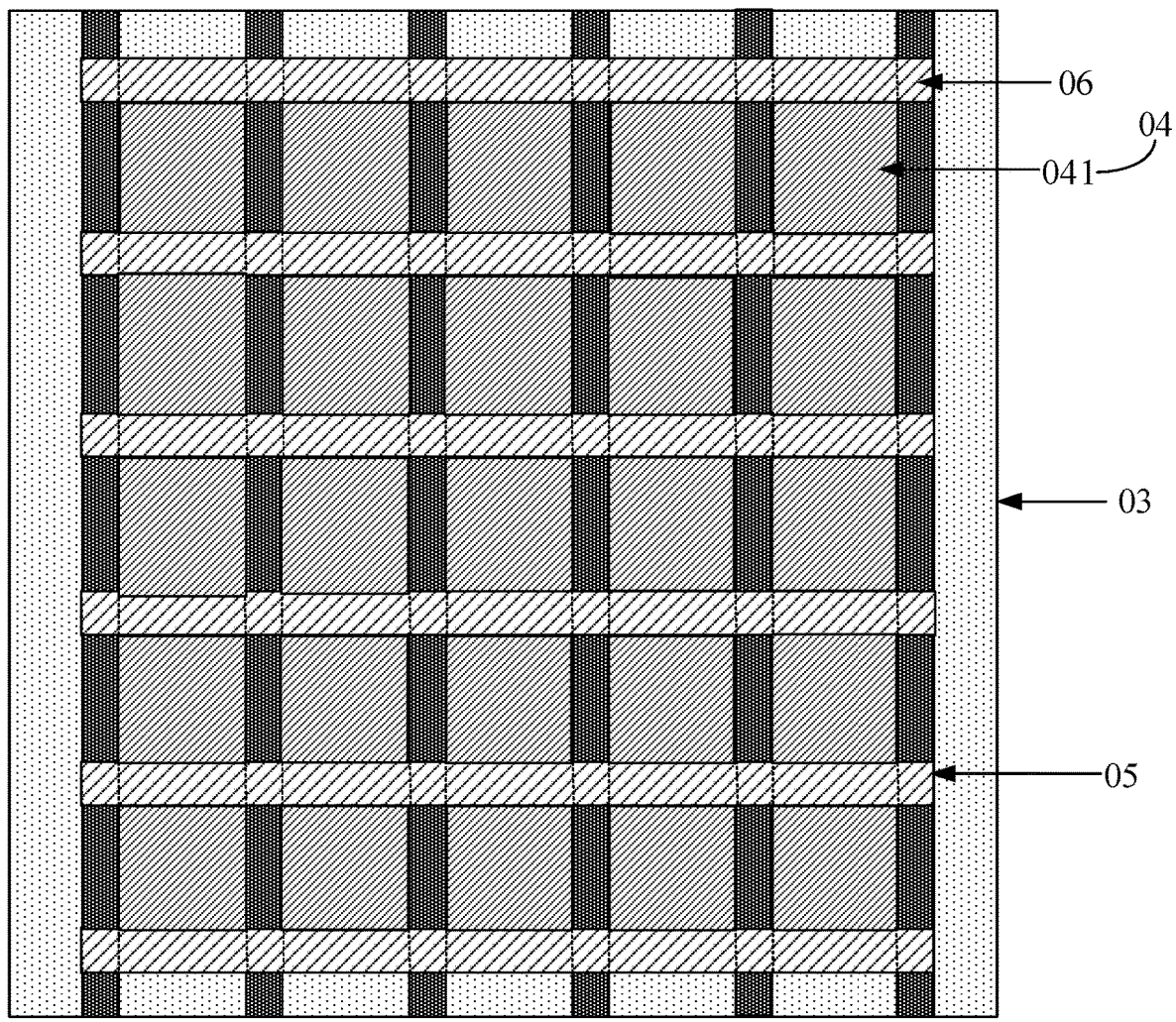
FIG. 11 is a structural schematic diagram of a display substrate provided by another embodiment of the present disclosure.

For example, as illustrated in FIG. 9, each second defining strip 06 is composed of a plurality of second defining segments (each second defining segment is a portion in the second defining strip 06 that is located between two adjacent first defining strips 05, and in FIG. 9, a case where each second defining strip 06 is composed of five second defining segments is taken as an example). At this time, there may be only one first defining strip 05 but no second defining strip 06 at a position where the second defining strip 06 intersects with the first defining strip 05 (i.e., an intersection) in the display substrate, that is, the second defining strip 06 may be interrupted by the first defining strip 05. Optionally, as illustrated in FIG. 11, the second defining strip 06 may also has an integral structure (which is not composed of a plurality of intermittent defining segments), and at this time, there may be both a first defining strip 05 and a second defining strip 06 at the position where the second defining strip 06 intersects with the first defining strip 05 in the display substrate, that is, the second defining strip 06 can span the first defining strip 05, which will not be limited in the embodiment of the present disclosure.

Optionally, the process of forming the first defining strip on the base substrate may be referred to for the process of forming the second defining strip on the base substrate, which will not be repeated here in the embodiment of the present disclosure.

The first defining strips 05 and the second defining strips 06 may be used for defining a plurality of sub-pixel regions on the base substrate. Exemplarily, the first defining strips 05 may be used for defining sub-pixel regions of a same color. For example, the first defining strips 05 may be used for defining red sub-pixel regions on the base substrate, in other words, a plurality of red sub-pixel regions are provided between two adjacent first defining strips 05. The second defining strip 06 may be used for defining sub-pixel regions of different colors. For example, the second defining strips 06 may be used for defining red sub-pixel regions and green sub-pixel regions, in other words, a plurality of sub-pixel regions of different colors are provided between two adjacent second defining strips 06.

Step 203: forming an auxiliary electrode layer on the base substrate on which the anode layer and the pixel defining layer (PDL) are formed.

Optionally, step 203 includes: forming a plurality of auxiliary electrode strips on the base substrate on which the anode layer and the pixel defining layer (PDL) are formed, each auxiliary electrode strip being located on a second defining strip, and each auxiliary electrode strip covering an entire top surface of each second defining strip.

Figure 12:
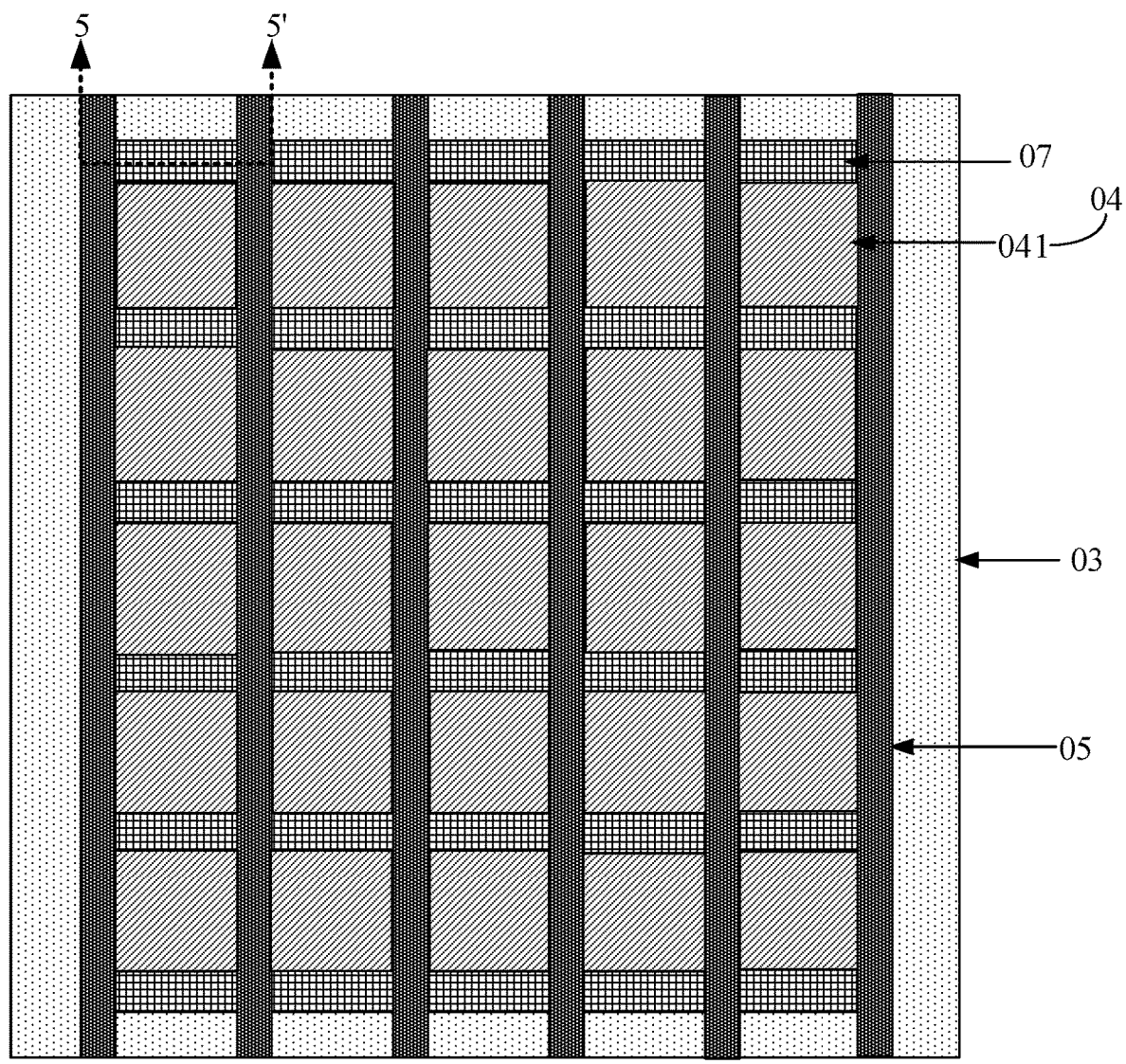
FIG. 12 is a structural schematic diagram of a display substrate provided by a further embodiment of the present disclosure.
Figure 13:
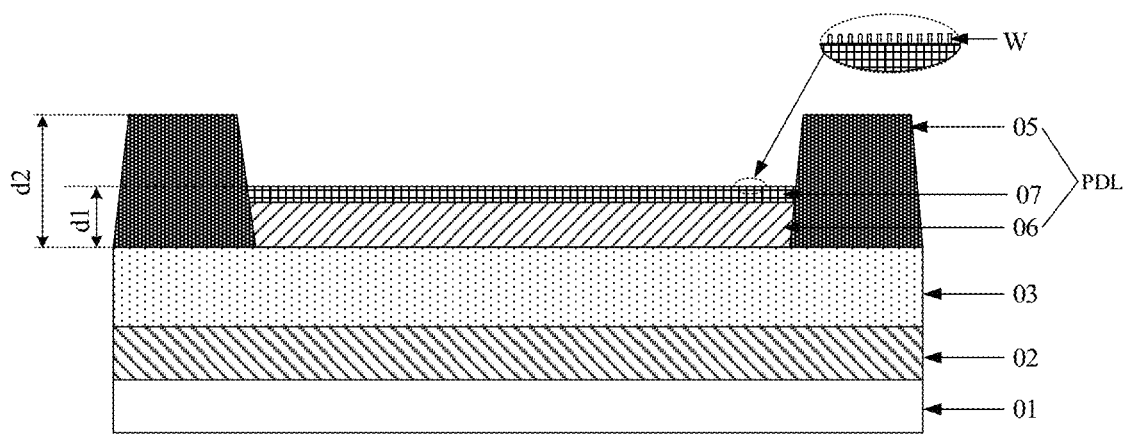
FIG. 13 is a schematically cross-section view taken along line 5-5' of FIG. 12.

After the pixel defining layer (PDL) is formed, as illustrated in FIG. 12 and FIG. 13, a plurality of auxiliary electrode strips 07 may be formed on the plurality of second defining strips 06 in the pixel defining layer (PDL). The plurality of auxiliary electrode strips 07 may constitute an auxiliary electrode layer. As illustrated in FIG. 12, the auxiliary electrode layer completely overlaps with the plurality of second defining strips 06 in a direction perpendicular to the base substrate 01. FIG. 13 is a schematically cross-section view taken along line 5-5' of FIG. 12. As illustrated in FIG. 13, a sum d1 of thicknesses of a second defining strip 06 and an auxiliary electrode strip 07 is less than a thickness d2 of a first defining strip 05.

Optionally, the first defining strips 05 may be used for defining sub-pixel regions of same color, the second defining strips 06 may be used for defining sub-pixel regions of different colors. A height of each first defining strip 05 with respect to the base substrate 01 is greater than a height of each second defining strip 06 with respect to the base substrate 01. For example, as illustrated in FIG. 13, in the case where the sum d1 of thicknesses of a second defining strip 06 and an auxiliary electrode strip 07 is less than the thickness d2 of a first defining strip 05, when the organic functional layer is formed by using the solution preparation method, the solution for preparing the organic functional layer may circulate within a column of sub-pixel regions (a column direction is parallel to an extension direction of a first defining strip 05), because the second defining strips 06 are lower. Because the solution circulates within a column of sub-pixel regions, the plurality of sub-pixels in the column of sub-pixel regions may be used for forming sub-pixels of a same color, with more uniform light emission. The first defining strips 05 are higher, so that any two columns of sub-pixel regions do not communicate with each other, and therefore, when any two adjacent columns of sub-pixels have different colors, solutions for forming the pixels of different colors cannot circulate within the any two adjacent columns of sub-pixel regions, which further prevents mutual contamination between solutions for pixels of different colors, and increases color purity of the display panel.

For example, the height of a first defining strip 05 is approximately 1.5 millimeters, and the height of a second defining strip 06 is approximately 0.3 millimeters; optionally, the height of a first defining strip 05 is approximately 1.3 millimeters, and the height of a second defining strip 06 is approximately 0.25 millimeters. The heights of the first and second defining strips will not be limited in the embodiment of the present disclosure.

Further, there may be various modes of forming the auxiliary electrode layer in step 203, and it will be explained in the present disclosure with two of them as an example.

A first mode of forming the auxiliary electrode layer is: firstly forming a conductive layer on the pixel defining layer, and etching a surface of the conductive layer that is away from the pixel defining layer to obtain the auxiliary electrode layer as illustrated in FIG. 12. With reference to FIG. 12 and FIG. 13, a plurality of micro-nano sized structures W are provided on the surface of the auxiliary electrode layer that is away from the second defining strips 06 of the pixel defining layer. For example, the plurality of micro-nano sized structures W are obtained by etching the surface of the conductive layer.

The micro-nano sized structure W is a structure in micron or nanometer scale. Exemplarily, the surface of the conductive layer that is away from the pixel defining layer may be etched by using laser etching method; exemplarily, the conductive layer may be irradiated by femtosecond laser combined with raster scanning, so as to implement ablation of the conductive layer, in this way, the micro-nano sized structure is formed on the surface of the conductive layer that is away from the second defining strip 06. Optionally, the surface of the conductive layer that is away from the pixel defining layer may also be etched by using ion etching method, etc. The etching method will not be limited in the embodiment of the present disclosure.

Optionally, the auxiliary electrode layer is made from metal material. For example, the auxiliary electrode layer may be made from metal material, such as aluminum, neodymium, copper, or silver. For example, the micro-nano sized structure includes a protrusion or a groove in micron or nanometer scale. For example, the shape of the protrusion may be a cylinder, a cuboid, or a cone, which will not be limited in the embodiment of the present disclosure. Exemplarily, when the shape the protrusion is a cylinder, a diameter of the protrusion may range from 10 nanometers to 1000 nanometers, and a height of the protrusion may range from 10 nanometers to 1000 nanometers.

Exemplarily, since there may be more air between the plurality of protrusions or grooves on the surface of the auxiliary electrode layer, a layer of air cushion is further formed to prevent a liquid from penetrating the auxiliary electrode layer, so that the surface of the auxiliary electrode layer has a hydrophobic property; the bigger the area occupied by the micro-nano sized structure on the surface of the auxiliary electrode layer, the larger the contact angle of the surface of the auxiliary electrode layer, and the better the hydrophobic property. For example, the hydrophobic properties of the surface of the auxiliary electrode layer may be changed by adjusting the size or the occupied area of the micro-nano sized structure on the surface of the auxiliary electrode layer. Further, since the auxiliary electrode layer is made from metal material and the micro-nano sized structure is made from metal material, the micro-nano sized structure is also electrically conductive.

A second mode of forming the auxiliary electrode layer is: firstly forming the conductive layer on the pixel defining layer, and forming a plurality of electrically conductive micro-nano sized structures on the surface of the conductive layer that is away from the pixel defining layer to obtain the auxiliary electrode layer 07 as illustrated in FIG. 12 and FIG. 13.

Optionally, the electrically conductive micro-nano sized structure may be deposited on the conductive layer by using physical vapor deposition or chemical vapor deposition. For example, physical vapor deposition refers to a process of vaporizing a conductive solid or liquid into gaseous atoms, molecules or ions by using a physical method under a vacuum condition, and then depositing the micro-nano sized structure on a conductive layer by using ion bombardment. The method of physical vapor deposition includes vacuum evaporation, molecular beam epitaxy, and so on. Chemical vapor deposition refers to a process of forming a micro-nano sized structure on a conductive layer by chemical reaction occurring to one or more gas phase compounds or elementary substances containing thin film elements.

Step 204: forming an organic functional layer on the base substrate on which the auxiliary electrode layer is formed by using the solution preparation method.

Optionally, after step 203 is executed, the organic functional layer may be formed on the base substrate by using the solution preparation method. For example, the organic functional layer includes: a plurality of film layers stacked. Exemplarily, the plurality of film layers may include: a hole injection layer, a hole transport layer, an electroluminescent layer, an electron transport layer, and an electron injection layer, which are sequentially arranged in a direction from the anode layer to the cathode layer. For example, the hole injection layer may include a hole injection block located on each anode block, the hole transport layer may include a hole transport block located on each hole injection block, the electroluminescent layer may include an electroluminescent block located on each hole transport block, the electron transport layer may include an electron transport block located on each electroluminescent block, and the electron injection layer may include an electron injection block located on each electron transport block.

Step 204 of forming an organic functional layer on the base substrate on which the auxiliary electrode layer by using the solution preparation method may include: sequentially forming the plurality of film layers on the base substrate by using the solution preparation method, the base substrate having the auxiliary electrode layer formed thereon.

Optionally, forming the plurality of film layers on the base substrate by using the solution preparation method may include: applying a solution for preparing each film layer on the base substrate on which the auxiliary electrode layer is formed, so that the solution for preparing each film layer on the base substrate is higher than the auxiliary electrode layer, that is, the auxiliary electrode layer is located below the solution; and drying the solution for preparing each film layer on the base substrate, to form each film layer. Optionally, there are various exemplary implementations of the solution preparation method, for example, an inkjet printing method.

It can be contemplated that, after step 203 is executed, it will be explained in the present disclosure with a process of forming any one film layer in the organic functional layer as an example, and the any one film layer may be the hole injection layer, the hole transport layer, the electroluminescent layer, the electron transport layer or the electron injection layer in the organic functional layer.

Figure 14:
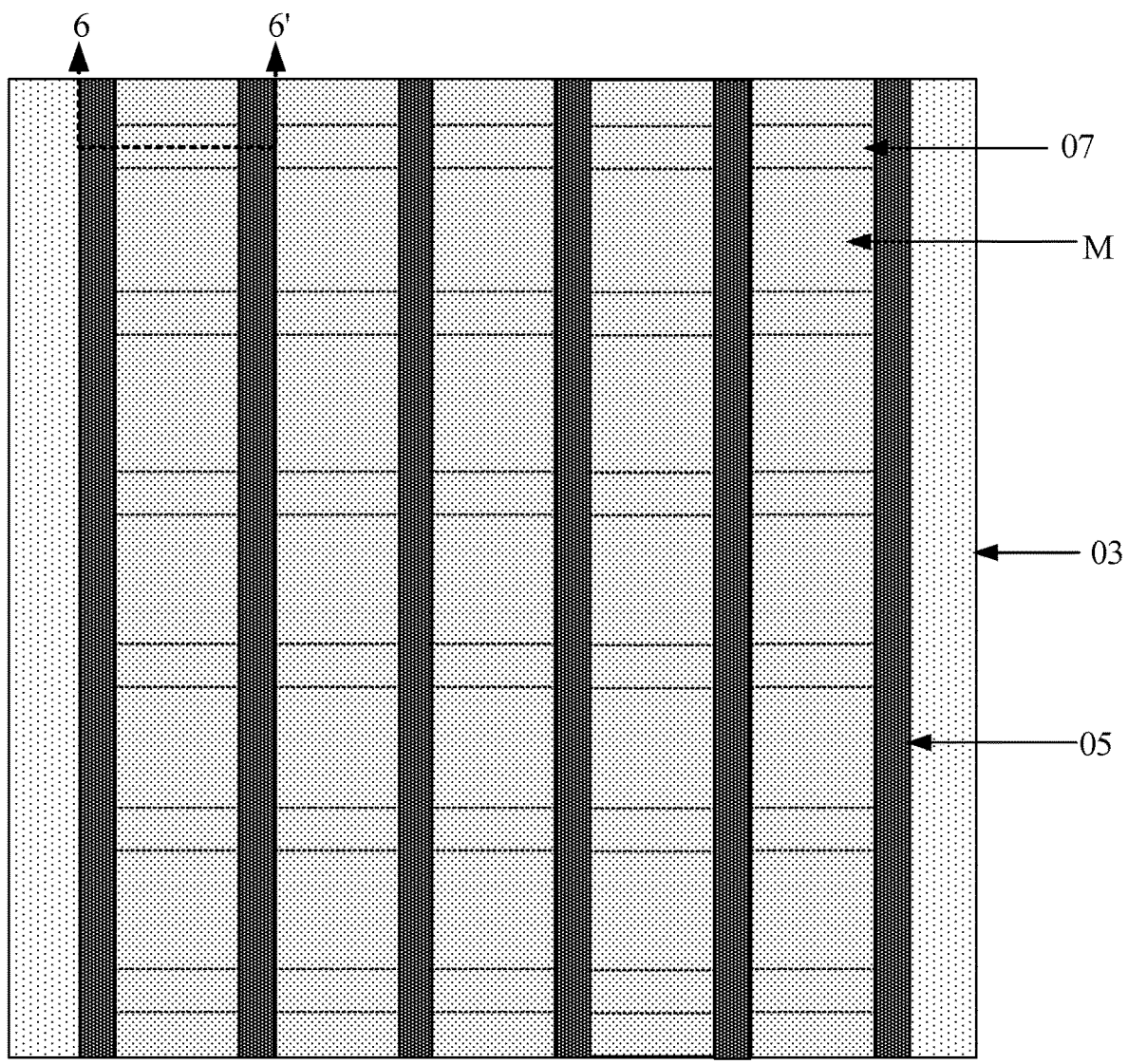
FIG. 14 is a structural schematic diagram of a display substrate provided by still another embodiment of the present disclosure.
Figure 15:
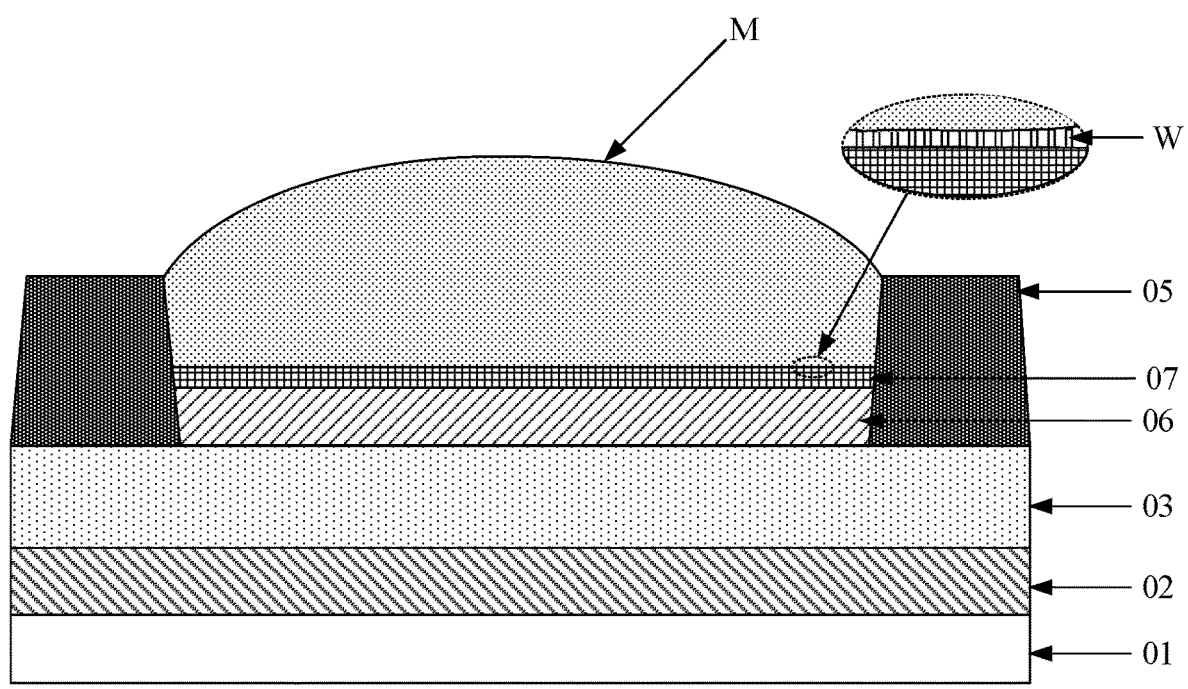
FIG. 15 is a schematically cross-section view taken along line 6-6' of FIG. 14.

As illustrated in FIG. 14 and FIG. 15, firstly, a solution M for preparing the any one film layer may be formed on the base substrate 01 on which the auxiliary electrode layer 07 is formed. FIG. 15 is a schematically cross-section view taken along line 6-6' of FIG. 14. It can be seen from FIG. 15 that, the solution M for preparing the any one film layer in the organic functional layer may be higher than the auxiliary electrode layer 07; because the solution M is higher than the auxiliary electrode layer 07, the solution may circulate in sub-pixel regions of a same color, so that the solution may be evenly distributed within the respective sub-pixel regions of the same color, to further improve uniformity of light emitted by the display panel. Optionally, as illustrated in FIG. 15, a surface of the solution for preparing any one film layer in the organic functional layer may be arched, and a center point of the surface of the solution may be higher than the first defining strip 05. However, with respect to the solution for preparing any one film layer in the organic functional layer, under an action of surface tension, an edge of the surface of the solution may be lower than the first defining strip 05 or may be flush with the first defining strip 05, to prevent the solution for preparing any one film layer in the organic functional layer from flowing into sub-pixel regions of other columns through the first defining strip 05.

Figure 16:
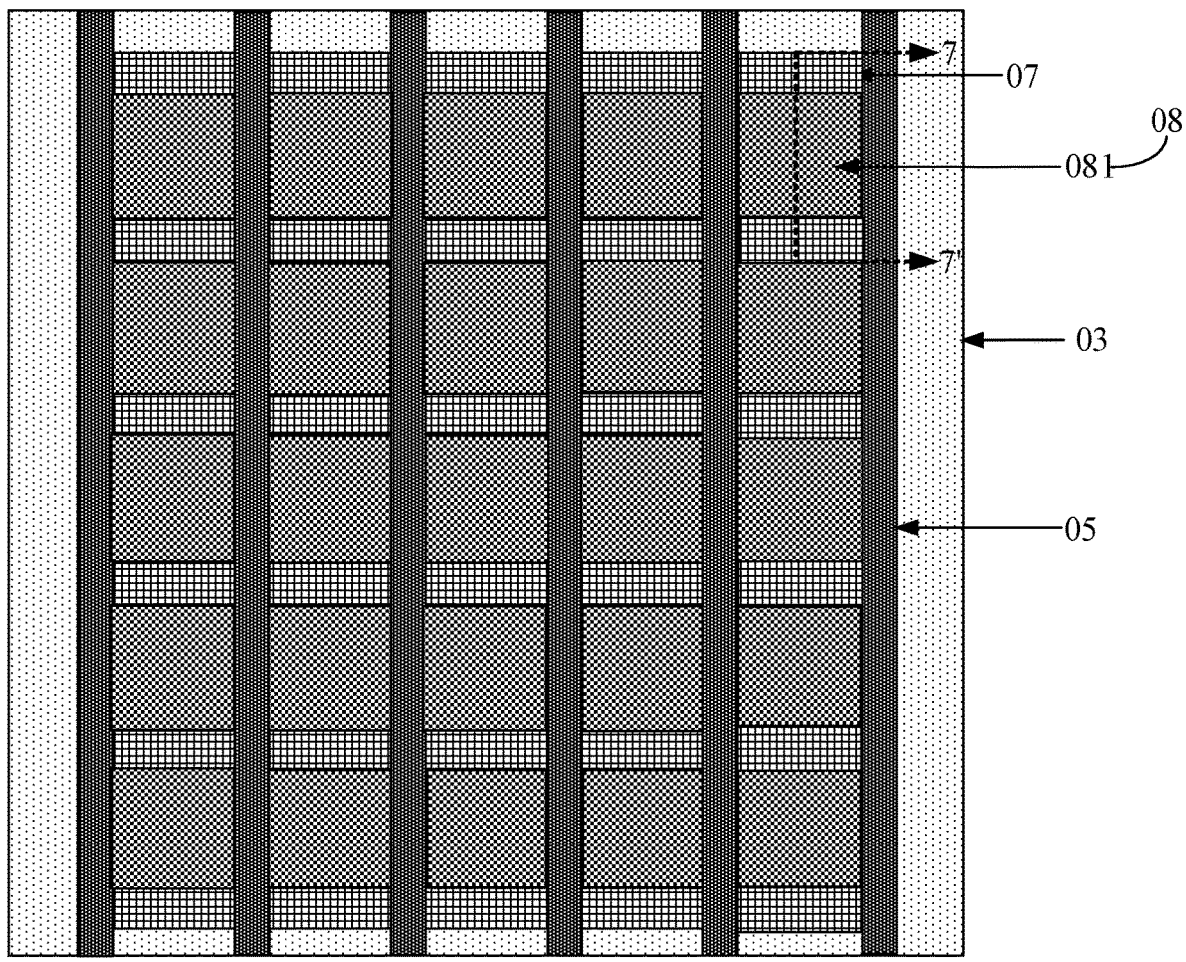
FIG. 16 is a structural schematic diagram of a display substrate provided by another embodiment of the present disclosure.
Figure 17:
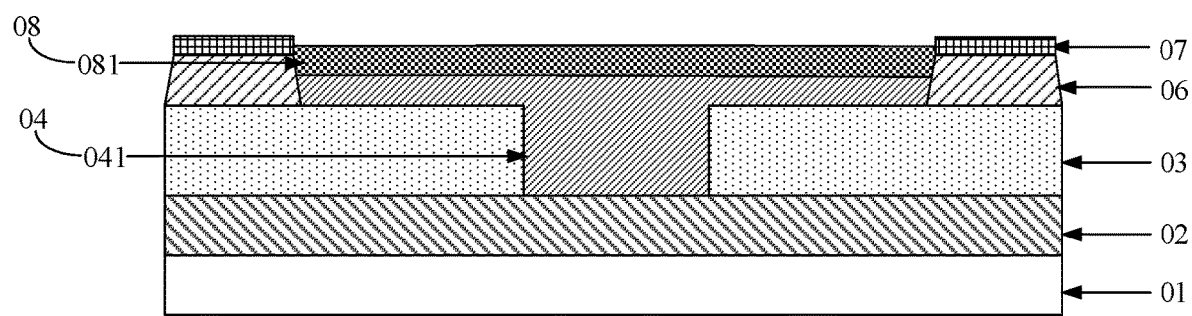
FIG. 17 is a schematically cross-section view taken along line 7-7' of FIG. 16.

After the solution M for preparing the any one film layer is applied to the base substrate on which the auxiliary electrode layer is formed, the solution is dried. During a drying process, while a solvent in the solution which is applied onto both the auxiliary electrode layer and the plurality of sub-pixel regions is gradually evaporated, the volume of the solution gradually shrinks. Because the auxiliary electrode layer has a hydrophobic property, the solution for preparing the any one film layer on the auxiliary electrode layer may leave the auxiliary electrode layer in a process of shrinkage, and all shrink within the sub-pixel region. While all the solvent in the solution is evaporated, a solute in the solution is entirely deposited within the sub-pixel region, so as to form the any one film layer of the organic functional layer. After the drying process, there is no residue, including the solution or the solute, etc., remaining on a top surface of the auxiliary electrode layer. For example, a top surface of the organic functional layer is lower than a top surface of the first defining strip. While all the film layers in the organic functional layer are formed, the organic functional layer 08 as illustrated in FIG. 16 and FIG. 17 is obtained. FIG. 17 is a schematically cross-section view taken along line 7-7' of FIG. 16. It can be seen from FIG. 17 that, a cross section 7-7' of the second defining strip provided by the embodiment of the present disclosure is in a trapezoid shape; optionally, the cross section of the second defining strip may also be of other shape, for example, a rectangle, a square, etc., which will not be limited in the embodiment of the present disclosure.

Exemplarily, the process of forming the hole injection layer, the hole transport layer, the electroluminescent layer, the electron transport layer and the electron injection layer in the plurality of film layers on the base substrate on which the auxiliary electrode layer is formed by using the solution preparation method will be briefly described.

Firstly, a solution for preparing the hole injection layer is formed on the base substrate on which the auxiliary electrode layer is formed, so that the solution for preparing the hole injection layer on the base substrate is higher than the auxiliary electrode layer; and the solution for preparing the hole injection layer is dried to form the hole injection layer.

Next, a solution for preparing the hole transport layer is formed on the base substrate on which the hole injection layer is formed, so that the solution for preparing the hole transport layer on the base substrate is higher than the auxiliary electrode layer; and the solution for preparing the hole transport layer on the base substrate is dried to form the hole transport layer.

Next, a solution for preparing the electroluminescent layer is formed on the base substrate on which the hole transport layer is formed, so that the solution for preparing the electroluminescent layer on the base substrate is higher than the auxiliary electrode layer; and the solution for preparing the electroluminescent layer on the base substrate is dried to form the electroluminescent layer.

Then, a solution for preparing the electron transport layer is formed on the base substrate on which the electroluminescent layer is formed, so that the solution for preparing the electron transport layer on the base substrate is higher than the auxiliary electrode layer; and the solution for preparing the electron transport layer is dried to form the electron transport layer.

Finally, a solution for preparing the electron injection layer is formed on the base substrate on which the electron transport layer is formed, so that the solution for preparing the electron injection layer on the base substrate is higher than the auxiliary electrode layer; and the solution for preparing the electron injection layer is dried to form the electron injection layer.

After the electron injection layer is formed, the formation of the organic functional layer on the base substrate on which the auxiliary electrode layer is formed is completed.

Optionally, the method for drying the solution for preparing any one film layer on the base substrate may be vacuum drying and atmospheric pressure drying, etc., which will not be limited in the embodiment of the present disclosure.

Step 205: forming a cathode layer on the base substrate on which the organic functional layer is formed.

For example, the cathode layer is electrically connected with both the organic function layer and the auxiliary electrode layer.

Figure 18:
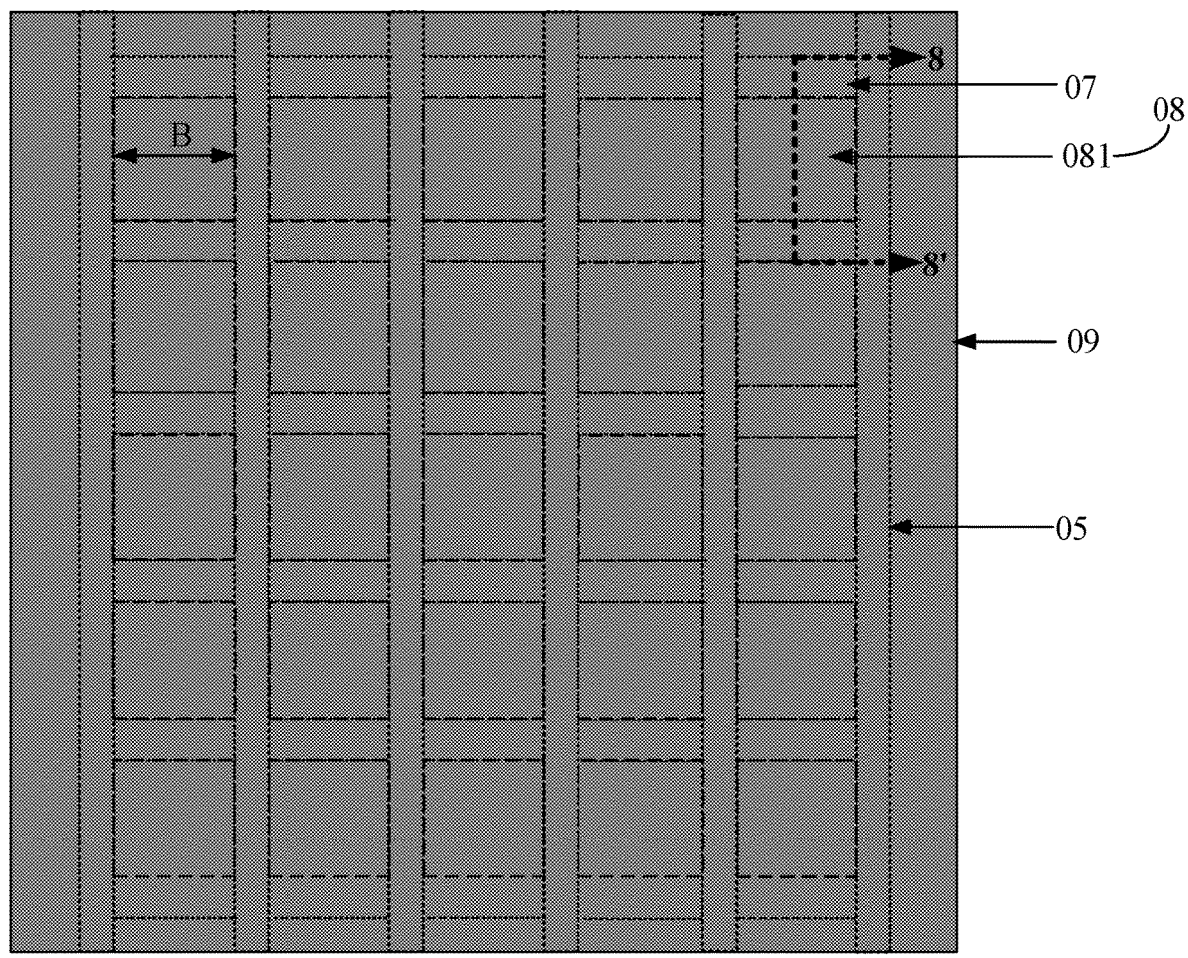
FIG. 18 is a structural schematic diagram of a display substrate provided by a further embodiment of the present disclosure.
Figure 19:
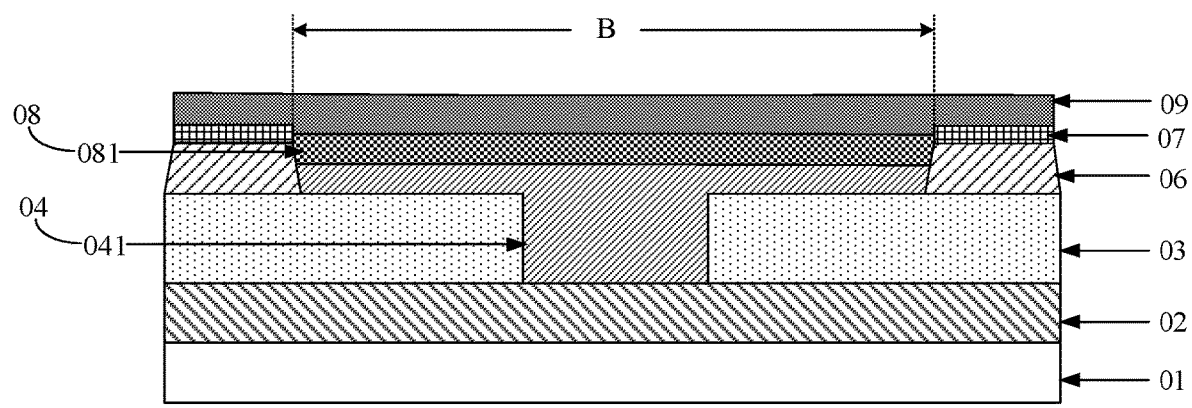
FIG. 19 is a schematically cross-section view taken along line 8-8' of FIG. 18.

After step 204 is executed, as illustrated in FIG. 18 and FIG. 19, a cathode layer 09 may be formed on the base substrate 01 on which the organic functional layer is formed. FIG. 19 is a schematically cross-section view taken along line 8-8' of FIG. 18. It can be seen that, there is no solution remaining on the auxiliary electrode layer for preparing any one film layer, after drying is completed in step 204, so the auxiliary electrode layer 07 and the cathode 09 can be better lapped with each other.

In summary, in the fabrication method of the display substrate provided by the embodiment of the present disclosure, the auxiliary electrode layer is located on the pixel defining layer, and the auxiliary electrode layer has conductive and hydrophobic properties. In this way, on the one hand, since the auxiliary electrode layer has the conductive property, the auxiliary electrode layer can be electrically connected with the cathode layer; on the other hand, since the auxiliary electrode layer also has the hydrophobic property, in the process of forming the organic functional layer by using the solution preparation method, it is hard for a solution to be sprayed and stay on the auxiliary electrode layer while the solution is used for preparation the organic functional layer; in this way, after the solution is dried, a solute of the solution does not remain on the auxiliary electrode layer, so that the auxiliary electrode layer may be better electrically connected with the cathode, and the display panel can also display normally.

For example, an embodiment of the present disclosure further provides a display substrate, as illustrated in FIG. 18 and FIG. 19, the display substrate comprises: a base substrate 01, an anode layer 04, a pixel defining layer (not illustrated in FIG. 18 and FIG. 19), an auxiliary electrode layer (not illustrated in FIG. 18 and FIG. 19), an organic functional layer 08, and a cathode layer 09.

For example, the anode layer 09 and the pixel defining layer are both located on the base substrate 01, and the pixel defining layer is used for defining a plurality of sub-pixel regions B on the base substrate. The anode layer 04 includes: an anode block 041 located within each sub-pixel region B.

It should be noted that, the auxiliary electrode layer is located on the pixel defining layer, and the auxiliary electrode layer has conductive and hydrophobic properties.

Optionally, the organic functional layer 08 includes an organic functional block 081 located on each anode block, and the organic functional layer 08 is fabricated by using a solution preparation method.

The cathode layer 09 is located on the organic functional layer 08 and the auxiliary electrode layer, and is electrically connected with both the organic functional block 081 and the auxiliary electrode layer.

In summary, in the display substrate provided by the embodiment of the present disclosure, the auxiliary electrode layer is located on the pixel defining layer, and the auxiliary electrode layer has conductive and hydrophobic properties. In this way, on the one hand, since the auxiliary electrode layer has the conductive property, the auxiliary electrode layer can be electrically connected with the cathode layer; on the other hand, since the auxiliary electrode layer also has the hydrophobic property, in the process of forming the organic functional layer by using the solution preparation method, it is hard for a solution to be sprayed and stay on the auxiliary electrode layer while the solution is used for preparation the organic functional layer; in this way, after the solution is dried, a solute of the solution does not remain on the auxiliary electrode layer, so that the auxiliary electrode layer may be better electrically connected with the cathode, and the display panel can also display normally.

Optionally, the display substrate may further comprise: a pixel circuit layer 02 and a planarization layer 03. The pixel circuit layer 02 may include a pixel circuit (not illustrated in FIG. 18 or FIG. 19) corresponding to each sub-pixel region.

Optionally, with reference to FIG. 13 and FIG. 15, a surface of the auxiliary electrode layer that is away from the pixel defining layer has a plurality of conductive micro-nano sized structures.

Optionally, the auxiliary electrode layer may have a superhydrophobic property. When a contact angle of a surface of a material is greater than 150°, the material is considered to have a superhydrophobic property. It should be noted that, the contact angle refers to an included angle between a tangent line of a gas-liquid interface taken at a gas-liquid-solid three-phase intersection point and a solid-liquid boundary line, which is a measure of wettability. Exemplarily, if the contact angle is less than 90°, the surface of the material is hydrophilic, that is, it is relatively easy for the liquid to soak the material; the smaller the contact angle, the better the wettability; if the contact angle is greater than 90°, the surface of the material is hydrophobic, that is, it is relatively hard for the liquid to soak the material, i.e., the liquid moves more easily on the surface of the material.

Optionally, with reference to FIG. 18 and FIG. 19, the pixel defining layer may include: a plurality of first defining strips 05 arranged in parallel on the base substrate 01, and a plurality of second defining strips 06 arranged in parallel on the base substrate 01. The plurality of first defining strips 05 intersect with the plurality of second defining strips 06 to define a plurality of sub-pixel regions B.

Optionally, the auxiliary electrode layer may include: a plurality of auxiliary electrode strips 07 located on the plurality of second defining strips 06.

Optionally, in the display substrate provided by the embodiment of the present disclosure, the anode layer is reflective, the cathode layer is transmissive, and at this time, the display substrate can emit light in a direction away from the base substrate, that is, the display substrate may be a top-emitting display substrate. Alternatively, in the display substrate provided by the embodiment of the present disclosure, the cathode layer is reflective, the anode layer is transmissive, and at this time, the display substrate can emit light in a direction close to the base substrate, that is, the display substrate may be a bottom-emitting display substrate.

An embodiment of the present disclosure further provides a display panel, and the display panel may comprise the display substrate illustrated in FIG. 18 and FIG. 19.

In summary, in the display substrate provided by the embodiment of the present disclosure, the auxiliary electrode layer is located on the pixel defining layer, and the auxiliary electrode layer has conductive and hydrophobic properties. In this way, on the one hand, since the auxiliary electrode layer has the conductive property, the auxiliary electrode layer can be electrically connected with the cathode layer; on the other hand, since the auxiliary electrode layer also has the hydrophobic property, in the process of forming the organic functional layer by using the solution preparation method, it is hard for a solution to be sprayed and stay on the auxiliary electrode layer while the solution is used for preparation the organic functional layer; in this way, after the solution is dried, a solute of the solution does not remain on the auxiliary electrode layer, so that the auxiliary electrode layer may be better electrically connected with the cathode, and the display panel can also display normally.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

What is described above is related to the illustrative embodiments of the disclosure only and not limitative to the scope of the disclosure; the scopes of the disclosure are defined by the accompanying claims

The invention claimed is:

1. A display substrate, comprising:
a base substrate;
a pixel defining layer, on the base substrate and configured to define a plurality of sub-pixel regions, each of the plurality of sub-pixel regions comprising a first electrode layer and a second electrode layer; and
an auxiliary electrode layer, on at least a portion of the pixel defining layer, the auxiliary electrode layer having a hydrophobic surface, and the hydrophobic surface being configured to be in contact with and electrically connected with the second electrode layer,
wherein the pixel defining layer comprises a plurality of first defining strips arranged in parallel and a plurality of second defining strips arranged in parallel, a plurality of sub-pixel regions of a same color are provided between two adjacent first defining strips of the plurality of first defining strips, a plurality of sub-pixel regions of different colors are provided between two adjacent second defining strips of the plurality of second defining strips, and a height of each of the plurality of first defining strips with respect to the base substrate is greater than a height of each of the plurality of second defining strips with respect to the base substrate,
wherein the auxiliary electrode layer comprises an auxiliary electrode strip on each of the plurality of second defining strips, and the auxiliary electrode strip covers an entire top surface of each of the plurality of second defining strips.

2. The display substrate according to claim 1, wherein the hydrophobic surface is a surface of the auxiliary electrode layer that is away from the pixel defining layer, and the hydrophobic surface comprises a plurality of micro-nano sized structures.

3. The display substrate according to claim 2, wherein the plurality of micro-nano sized structures comprise a plurality of protrusions in micron scale or nanometer scale or a plurality of grooves in micron scale or nanometer scale.

4. The display substrate according to claim 1, wherein a sum of thicknesses of each of the plurality of second defining strips and an auxiliary electrode strip thereon is less than a thickness of each of the plurality of first defining strips.

5. The display substrate according to claim 1, wherein the auxiliary electrode layer completely overlaps with the plurality of second defining strips in a direction perpendicular to the base substrate.

6. A display panel, comprising the display substrate according to claim 1.

7. A fabrication method of a display substrate, comprising:
providing a base substrate;
forming a pixel defining layer on the base substrate, the pixel defining layer being configured to define a plurality of sub-pixel regions;
forming a first electrode layer and a second electrode layer in each of the plurality of sub-pixel regions; and
forming an auxiliary electrode layer on at least a portion of the pixel defining layer, the auxiliary electrode layer having a hydrophobic surface, and the hydrophobic surface being configured to be in contact with and electrically connected with the second electrode layer,
wherein the forming the pixel defining layer on the base substrate comprises:
forming a plurality of first defining strips arranged in parallel on the base substrate, a plurality of sub-pixel regions of a same color being provided between two adjacent first defining strips of the plurality of first defining strips; and
forming a plurality of second defining strips arranged in parallel on the base substrate, a plurality of sub-pixel regions of different colors being provided between two adjacent second defining strips of the plurality of second defining strips,
a height of each of the plurality of first defining strips with respect to the base substrate being greater than a height of each of the plurality of second defining strips with respect to the base substrate,
wherein the forming the auxiliary electrode layer on at least the portion of the pixel defining layer comprises:
forming an auxiliary electrode strip on each of the plurality of second defining strips, the auxiliary electrode strip covering an entire top surface of each of the plurality of second defining strips.

8. The method according to claim 7, wherein the hydrophobic surface is a surface of the auxiliary electrode layer that is away from the pixel defining layer, and the hydrophobic surface comprises a plurality of micro-nano sized structures.

9. The method according to claim 8, wherein the plurality of micro-nano sized structures comprise a plurality of protrusions or a plurality of grooves on micron scale or nanometer scale.

10. The method according to claim 8, wherein the forming the auxiliary electrode layer on at least the portion of the pixel defining layer, comprises:
forming a conductive layer on at least the portion of the pixel defining layer, and etching a surface of the conductive layer that is away from the pixel defining layer to obtain the auxiliary electrode layer having the plurality of micro-nano sized structures.

11. The method according to claim 7, wherein a sum of thicknesses of each of the plurality of second defining strips and an auxiliary electrode strip thereon is less than a thickness of each of the plurality of first defining strips.

12. The method according to claim 7, wherein the auxiliary electrode layer completely overlaps with the plurality of second defining strips in a direction perpendicular to the base substrate.

13. The method according to claim 7, wherein after the forming the auxiliary electrode strip and before the forming the second electrode layer, the method further comprises:
forming an organic functional layer by using a solution preparation method on the base substrate on which the auxiliary electrode strip is formed.

14. The method according to claim 13, wherein the forming the organic functional layer by using the solution preparation method comprises:
forming a solution for preparing the organic functional layer between the two adjacent second defining strips of the plurality of the second defining strips, the solution being configured to circulate in the plurality of sub-pixel regions of a same color located between the two adjacent second defining strips, the auxiliary electrode strip being located below the solution; and
drying the solution to shrink the solution into each sub-pixel region of the plurality of sub-pixel regions of the same color.

15. The method according to claim 13, wherein the solution preparation method comprises an inkjet printing method.

\* \* \* \* \*